United States Patent
Yin

(10) Patent No.: US 11,361,159 B2
(45) Date of Patent: *Jun. 14, 2022

(54) ENCODING AND STORING TEXT USING DNA SEQUENCES

(71) Applicant: AT&T Intellectual Property I, L.P., Atlanta, GA (US)

(72) Inventor: Changchuan Yin, Hoffman Estates, IL (US)

(73) Assignee: AT&T Intellectual Property I, L.P., Atlanta, GA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/241,361

(22) Filed: Apr. 27, 2021

(65) Prior Publication Data

US 2021/0248318 A1 Aug. 12, 2021

Related U.S. Application Data

(63) Continuation of application No. 16/143,671, filed on Sep. 27, 2018, now Pat. No. 11,017,170.

(51) Int. Cl.
*G06F 40/284* (2020.01)
*G06F 40/242* (2020.01)

(52) U.S. Cl.
CPC .......... *G06F 40/284* (2020.01); *G06F 40/242* (2020.01)

(58) Field of Classification Search
None
See application file for complete search history.

(56) References Cited

U.S. PATENT DOCUMENTS

| 5,825,830 A | 10/1998 | Kopf |
| 10,370,246 B1 | 8/2019 | Milenkovic et al. |

(Continued)

FOREIGN PATENT DOCUMENTS

WO 2019040871 A1 2/2019

OTHER PUBLICATIONS

Goldman, Nick, Paul Bertone, Siyuan Chen, Christophe Dessimoz, Emily M. LeProust, Botond Sipos, and Ewan Birney. "Towards pracitical, high-capcity, low-mainenance information storage in synthesized DNA." Nature 494, No. 7435 (2013): 77-80 (Year: 2013).*

Goldman et al., Supplementary Information: Human-Designed Information Stored in DNA (2013), https://static-content.speinger.com/esm/art%3A10.1038%2Fnature11875/MediaObjects/41586_2013_BFnature11875_MOESM336_ESM.pdf, at 1-6. (Year: 2013).*

(Continued)

*Primary Examiner* — Frank D Mills
(74) *Attorney, Agent, or Firm* — Guntin & Gust, PLC; Robert Gingher

(57) ABSTRACT

Text can be encoded into DNA sequences. Each word from a document or other text sample can be encoded in a DNA sequence or DNA sequences and the DNA sequences can be stored for later retrieval. The DNA sequences can be stored digitally, or actual DNA molecules containing the sequences can be synthesized and stored. In one example, the encoding technique makes use of a polynomial function to transform words based on the Latin alphabet into k-mer DNA sequences of length k. Because the whole bits required for the DNA sequences are smaller than the actual strings of words, storing documents using DNA sequences may compress the documents relative to storing the same documents using other techniques. In at least one example, the mapping between words and DNA sequences is one-to-one and the collision ratio for the encoding is low.

20 Claims, 4 Drawing Sheets

Specification includes a Sequence Listing.

(56) References Cited

U.S. PATENT DOCUMENTS

| | | |
|---|---|---|
| 10,423,341 B1 | 9/2019 | Kermani |
| 10,566,077 B1 | 2/2020 | Milenkovic et al. |
| 2003/0219756 A1* | 11/2003 | Wong ................ G11C 13/0014 |
| | | 435/6.12 |
| 2005/0053968 A1 | 3/2005 | Bharadwaj et al. |
| 2005/0268341 A1 | 12/2005 | Ross |
| 2010/0057681 A1 | 3/2010 | Willeford |
| 2013/0031092 A1* | 1/2013 | Bhola ................... H03M 7/46 |
| | | 707/E17.089 |
| 2013/0262486 A1* | 10/2013 | O'Dell ................... G06F 16/30 |
| | | 707/755 |
| 2015/0121478 A1 | 4/2015 | Huang et al. |
| 2015/0261664 A1 | 9/2015 | Goldman et al. |
| 2016/0358055 A1 | 12/2016 | Church |
| 2017/0017436 A1 | 1/2017 | Church |
| 2017/0338943 A1 | 11/2017 | Lu et al. |
| 2018/0002725 A1 | 1/2018 | Ganjam |
| 2018/0121478 A1 | 5/2018 | Walder et al. |
| 2018/0139055 A1 | 5/2018 | Brathwaite |
| 2018/0265921 A1 | 9/2018 | Chen et al. |
| 2019/0080760 A1 | 3/2019 | Predki et al. |
| 2019/0136307 A1 | 5/2019 | Predki et al. |
| 2019/0138909 A1 | 5/2019 | Shen et al. |
| 2019/0311782 A1 | 10/2019 | Dai et al. |
| 2019/0317684 A1 | 10/2019 | Kwon et al. |
| 2019/0376120 A1 | 12/2019 | Strauss et al. |
| 2020/0211677 A1 | 7/2020 | Fan |

OTHER PUBLICATIONS

Goldman et al., Supp. Info. Encoding and Decoding Arbitrary Files in DNA Fragments (2013), https://static-content.speinger.com/esm/art%3A10.1038%2Fnature11875/MediaObjects/41586_2013_BFnature11875_MOESM337_ESM.pdf, at 1-6. (Year: 2013).*

Erlich, Yaniv, and Dina Zielinski. "DNA Fountain enables a robust and efficent storage architecture." Science 335, No. 6328 (2017): 950-954 (Year: 2017).*

De Silva, Pavani Yashodha, and Gamage Upeksha Ganegoda. "New trends of digital data storage in DNA." BioMed research international 2016 (2016). (Year: 2016).*

De Silva, Pavani Y. et al., "New Trends of Digital Data Storage in DNA", BioMed Research Internationl, 2016, 15 pages.

Erlich, Yaniv et al., "DNA Fountain Enables a Robust and Efficient Storage Architecture", Science 355, No. 6328, 2017, pp. 950-954.

Goldman, et al., "Supplementary Information Encoding and Decoding Arbitrary Files in DNA Fragments", https://wstatic-content.springer.com/esm/art%3A10.1038%2Fnature11875/MediaObjects/41586_2013_BFnature11875_MOESM337ESM.pdf, 2013, pp. 1-6.

Goldman, et al., "Supplementary Information: Human-Designed Information Stored in DNA", https://static-content.springer.com/esm/art%3A10.1038%2Fnature11875/MediaObjects/41586_2013_BFnature11875_MOESM336_VESM.pdf, 2013, pp. 1-17.

Goldman, Nick et al., "Towards Practical, High-Capacity, Low-Maintenance Information Storage in Synthesized DNA", Nature 494, No. 7435, 2013, pp. 77-80.

* cited by examiner

ENCODING AND STORING TEXT USING DNA SEQUENCES

CROSS REFERENCE TO RELATED APPLICATIONS

This application is a continuation of U.S. patent application Ser. No. 16/143,671 filed Sep. 27, 2018. The contents of each of the foregoing are hereby incorporated by reference into this application as if set forth herein in full.

TECHNICAL FIELD

This disclosure generally relates to encoding textual information. More specifically, this disclosure relates to using DNA sequences to encode words.

REFERENCE TO SEQUENCE LISTING SUBMITTED VIA EFS-WEB

This application includes an electronically submitted sequence listing in .txt format. The .txt file contains a sequence listing entitled "OATTMISC10-1098009 ST25.txt" created on Jan. 2, 2019 and is 470 bytes in size. The sequence listing contained in the .txt file is part of the specification and is hereby incorporated by reference herein in its entirety.

BACKGROUND

The volume of documents that have historical significance is ever increasing. But, available physical storage space is not. Density can be increased with compression techniques, especially those that are tailored to the type of information being stored by taking advantage of predictable properties in the information. Certain types of media, such as write-once optical discs, exhibit more longevity than other types of media, such as magnetic discs. But, thermodynamics does not favor information lasting a long time. Active archiving can be used to shuttle data between media in a storage network to overcome media degradation over time, but with a cost in terms of energy.

SUMMARY

In one example, a system includes a storage device, a non-transitory computer-readable medium including computer program code for DNA encoding of text, and a processing device communicatively coupled to the storage device and the non-transitory computer-readable medium. The processing device is configured for executing the computer program code to perform operations. The operations include receiving a word to be converted into a DNA sequence, determining a value of a polynomial function based on the word, obtaining a remainder of a modulus of the value of the polynomial function, converting the remainder of the modulus into the DNA sequence, and storing the DNA sequence in the storage device.

In another example, a method includes receiving a word to be converted into a DNA sequence and determining a value of a polynomial function based on the word. The method also includes obtaining a remainder of a modulus of the value of the polynomial function, and converting the remainder of the modulus into the DNA sequence. The method further includes storing the DNA sequence in a storage device.

In another example, a non-transitory computer-readable medium includes computer program code executable by a processor to cause the processor to perform operations. The operations include receiving a word to be converted into a DNA sequence, determining a value of a polynomial function based on the word, and obtaining a remainder of a modulus of the value of the polynomial function. The operations further include converting the remainder of the modulus into the DNA sequence and storing the DNA sequence in a storage device.

BRIEF DESCRIPTION OF THE FIGURES

These and other features, aspects, and advantages of the present disclosure are better understood when the following Detailed Description is read with reference to the accompanying drawings.

DETAILED DESCRIPTION

Certain aspects of this disclosure relate to programmatically analyzing a word from a document or other text sample, encoding the word in a DNA sequence using a polynomial function of a numerical representation of the word, and storing the DNA sequence for later retrieval. The DNA sequence can be stored digitally, or an actual DNA molecule of the sequence can be synthesized and stored to take advantage of the fact that DNA molecules exhibit longevity under readily achievable conditions. Capturing and encoding words in a document in this fashion allows the document to be encoded into and stored as a collection of DNA sequences. Using DNA sequences to represent words, entire documents can be stored, retrieved, compared, analyzed, and visualized in more effective ways than would be possible with more traditional storage techniques.

In certain aspects, the encoding technique makes use of a polynomial function to transform words based on the Latin alphabet into k-mer DNA sequences of length k. Because the whole bits required for the DNA sequences are smaller than the actual strings of words, storing documents using DNA sequences may compress the documents relative to storing the same documents using other techniques. In certain aspects, the mapping between words and DNA sequences is one-to-one and the collision ratio for the encoding is very low, making for fast, efficient, and certain retrieval of the encoded text from storage.

Detailed descriptions of certain examples are discussed below. These illustrative examples are given to introduce the reader to the general subject matter discussed here and are not intended to limit the scope of the disclosed concepts. The following sections describe various additional aspects and examples with reference to the drawings in which like numerals indicate like elements, and directional descriptions are used to describe the illustrative examples but, like the illustrative examples, should not be used to limit the present disclosure.

Figure 1:
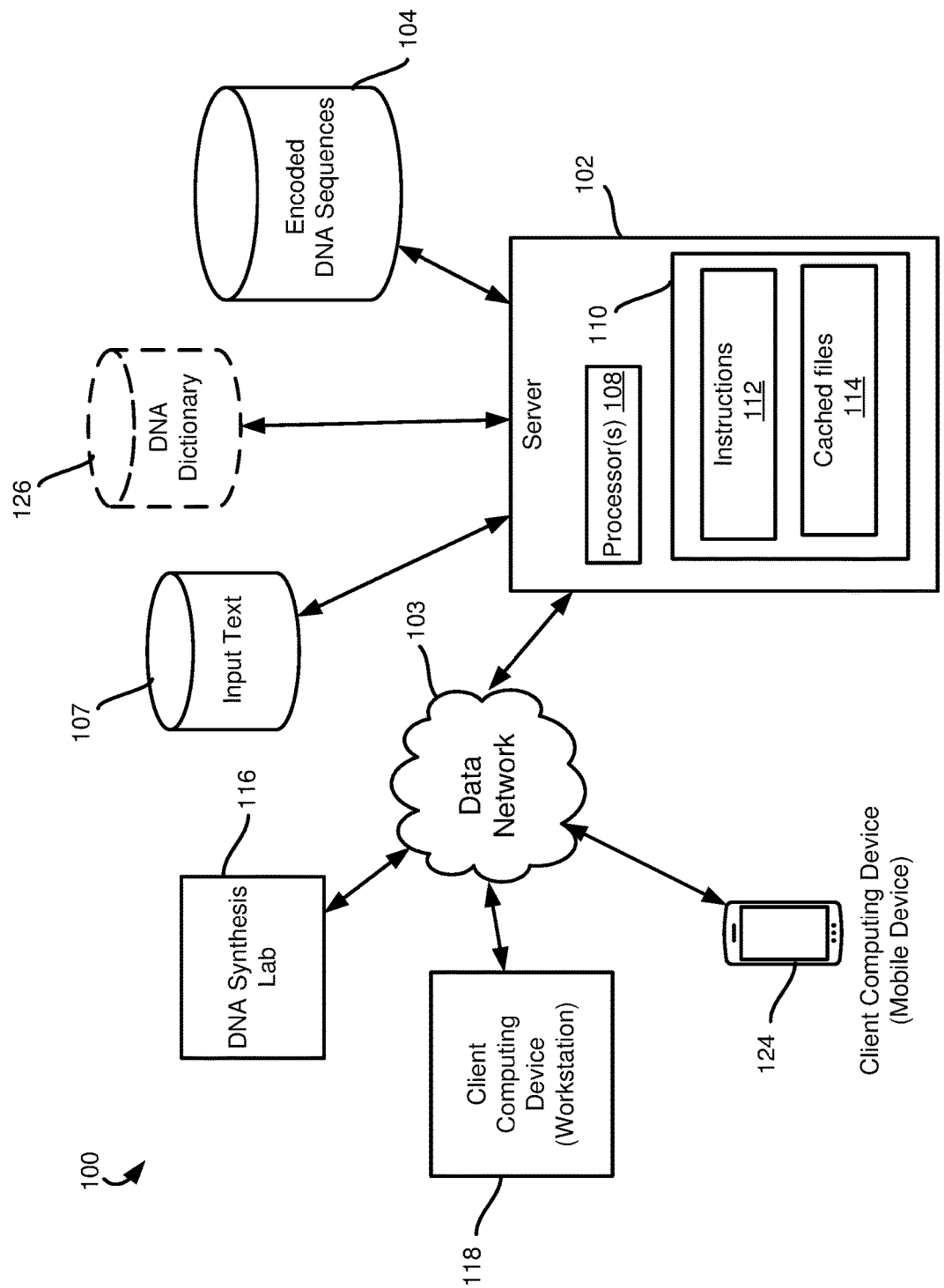
FIG. 1 is a block diagram depicting a system for encoding and storing words in DNA sequences according to some aspects of the present disclosure.

Referring now to the drawings, FIG. 1 depicts an example of a system 100 for encoding text into DNA sequences according to some aspects. Examples of hardware components of the system 100 are depicted. The system 100 includes server 102. Server 102 may be a computer or other machine that processes the text words received within the system 100. The server 102 may include one or more other systems. For example, the server 102 may include adapters, routers, etc., for accessing network-attached data stores, a communications network, or both. In this example, server 102 is connected to data network 103. The data network 103 can also be incorporated entirely within (or can include) the Internet, an intranet, an extranet, or a combination thereof. In one example, communications between two or more systems or devices can be achieved by a secure communications protocol, such as secure sockets layer ("SSL") or transport layer security ("TLS"). The system 100 includes one or more attached data stores 104, which can include stored DNA sequences. The DNA sequences are produced from input text samples stored in one or more data stores 107.

The system 100 of FIG. 1 also optionally includes one or more attached data stores 126, which further include a pre-encoded DNA dictionary of sequences for commonly used words. Data stores 104, 107, and 126 may be connected to server 102 over data network 103 instead of being connected locally as illustrated in FIG. 1. Server 102 further includes a processing device 108 communicatively coupled to a non-transitory memory device 110. Non-transitory memory device 110 is used to store computer program code instructions 112 for causing processing device 108 to perform operations for DNA encoding of text as described herein. Non-transitory memory device 110 may also include cached files 114, such as text samples and DNA sequence files currently being used by the processing device to perform these operations. Processing device 108 can include a processor or multiple processors.

Still referring to FIG. 1, data network 103 in system 100 connects server 102 to DNA synthesis lab computer systems 116 and client computing devices 118 and 124. The DNA synthesis optionally performed using computer systems 116 may be an in-house capability of an enterprise that provides DNA sequence encoding using server 102 or may be provided by a third party. Client computing device 118 in this example is a workstation through which text samples can be selected or entered by a user and sent over data network 103 to server 102 for storage in data store 107, as part of cached files 114, or both. Client computing device 124 is a mobile computing device through which text samples can be selected or entered by a user and sent over data network 103 to server 102 for storage in data store 107, as part of cached files 114, or both.

The numbers of devices depicted in FIG. 1 are provided for illustrative purposes. Different numbers of devices may be used. For example, while each device, server, and system in FIG. 1 is shown as a single device, multiple devices may instead be used. Each communication within the system 100 may occur over one or more data networks 103. Data networks 103 may include one or more of a variety of different types of networks, including a wireless network, a wired network, or a combination of a wired and wireless network. Examples of suitable networks include the Internet, a personal area network, a local area network ("LAN"), a wide area network ("WAN"), or a wireless local area network ("WLAN"). A wireless network may include a wireless interface or combination of wireless interfaces. A wired network may include a wired interface. The wired or wireless networks may be implemented using routers, access points, bridges, gateways, or the like, to connect devices in the data network 103.

Any computing device that implements DNA encoding according to at least some aspects of the present disclosure may contain many of the same elements as described with respect to server 102 of FIG. 1. As an example, a computing device may include a main processing device, control, and power logic, RAM, flash memory, a battery, and the audio and visual I/O. The processing device can execute one or more operations for transmitting, receiving, and decoding signals. The processing device can execute instructions stored in a non-transitory memory device such as non-transitory memory device 110 to perform the operations. The processing device can include one processing device or multiple processing devices. Non-limiting examples of a processing device include a field-programmable gate array ("FPGA"), an application-specific integrated circuit ("ASIC"), a microprocessor, etc.

A memory device storing computer program instructions executable by the processing device can include any type of memory device that retains stored information when powered off. A computer-readable medium can include electronic, optical, magnetic, or other storage devices capable of providing the processing device with computer-readable instructions or other program code. Such a medium may store the instructions on a server prior to installation in or programming of a proximity-based security mechanism. Non-limiting examples of a computer-readable medium include (but are not limited to) magnetic disk(s), memory chip(s), read-only memory (ROM), random-access memory ("RAM"), an ASIC, a configured processing device, optical storage, or any other medium from which a computer processing device can read instructions.

The processes discuss below are examples illustrating DNA encoding of English words. The techniques illustrated can be used with little or no modification to encode words in any language that uses the Latin alphabet. The techniques can be applied to words in other languages, including languages that are not based on the Latin alphabet with appropriate modifications.

Figure 2:
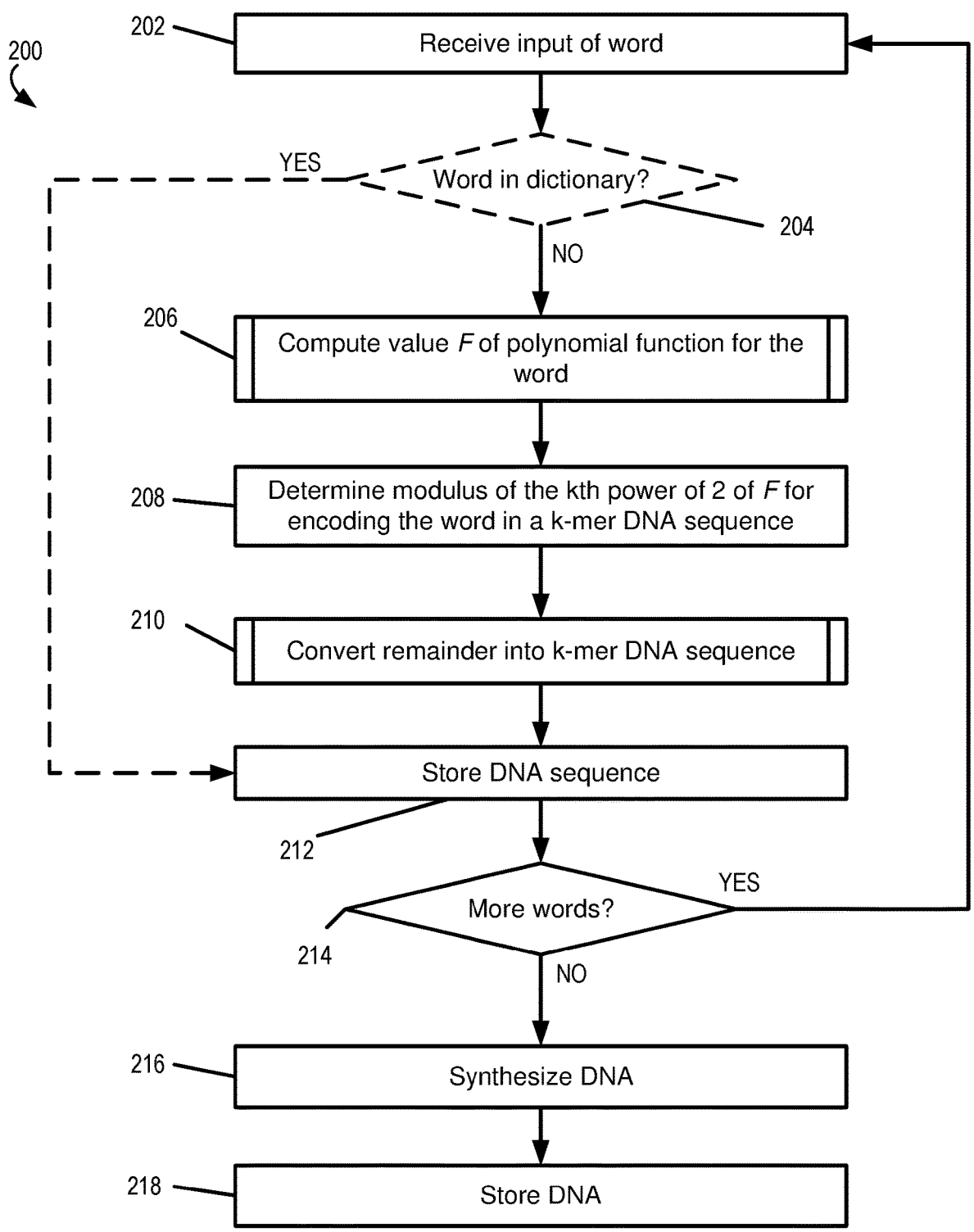
FIG. 2 is a flowchart illustrating a process for encoding and storing words in DNA sequences according to some aspects of the present disclosure.

FIG. 2 depicts a flowchart illustrating a process 200 for providing DNA encoding of text according to some aspects of the present disclosure. At block 202, an input word is received by processing device 108, possibly from the data store 107. If a stored DNA dictionary is being used, a determination is made at block 204 by processing device 108 as to whether the input word is present in the DNA dictionary data store 126. If so, the DNA sequence for the word is stored at block 212 in data stores 104. Otherwise, the value F of a polynomial function of the word is computed at block 206 by processing device 108.

Still referring to FIG. 2, at block 208, processing device 108 determines the modulus of the kth power of two of F for encoding the word in a k-mer DNA sequence. At block 210, processing device 108 converts a remainder from block 208 into the k-mer DNA sequence. At block 212, the k-mer DNA sequence is stored in data stores 104. At block 214, if there are more words in the text sample to be encoded into DNA sequences, process 200 begins again at block 202. Otherwise, the DNA specified by the sequences corresponding to the text sample is synthesized at block 216, for example, by a DNA synthesis lab that uses computer systems 116. The DNA can then be stored for long-term use at block 218.

Figure 3:
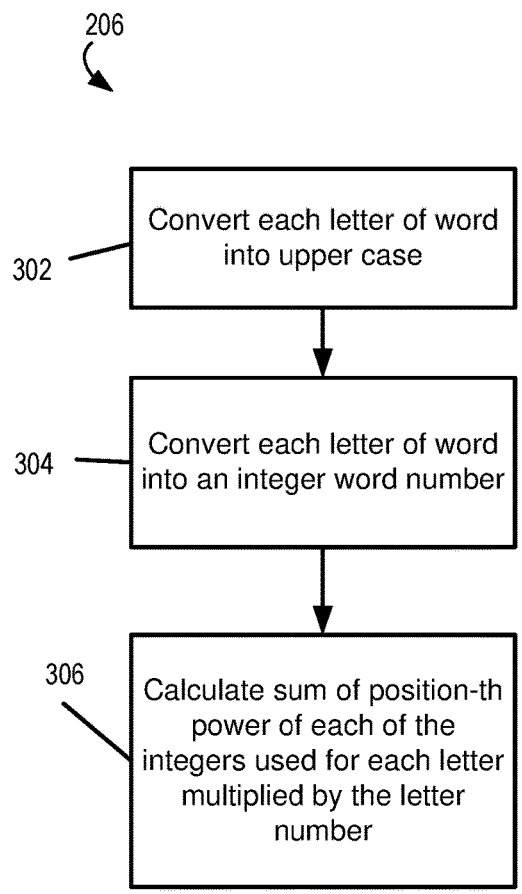
FIG. 3 is a flowchart illustrating a process used in encoding words according to additional aspects of the present disclosure.

For purposes of FIGS. 3 and 4, an illustrative example of a word to be encoded will be discussed. Specifically, the word "music" will be used. FIG. 3 illustrates the process of block 206 of FIG. 2 according to some aspects of the present disclosure. At block 302, each letter of the word is converted into upper case. For example, "music," "Music," or "MUSIC" are all represented at this point as "MUSIC." At block 304, each letter of the word is converted into a letter number. If English is the language in use, each upper case alphabetical letter of the 26 Latin letters used in English can be converted to an integer from 0 to 25 as follows: A=0, B=1, C=2, D=3, E=4, F=5, G=6, H=7, I=8, J=9, K=10, L=11, M=12, N=13, O=14, P=15, Q=16, R=17, S=18, T=19, U=20, V=21, W=22, X=23, Y=24, and Z=25. The word "music" would then appear as: 12, 20, 18, 8, 2. A language based on an alphabet with more or less characters can be represented by a larger or smaller integer space. The integer space could include, as an example, letters with specific types of accent marks if these are important in the language of interest.

Continuing with FIG. 3, at block 306, processing device 108 calculates the sum of the position-th power of for each of the integers used multiplied by the letter number to determine the integer value of F. For a word of length m, the sum of the position-th power of 26 for each letter multiplied by the letter number is used. The equation for the polynomial function F in this case is as follows:

$$F(\alpha, k) = \sum_{k=1}^{m} \alpha 26^k, \alpha \in \Gamma$$

For the word "music":

$$F=12*26^0+20*26^1+18*26^2+8*26^3+2*26^4=1067260.$$

A DNA sequence consists of four nucleotides represented by the letters A, T, C and G. Each nucleotide character, A, T, C and G, needs two bits for storage. FIG. 4 illustrates the process of block 210 of FIG. 2 according to some aspects of the present disclosure. For the example of FIG. 4, each nucleotide can be mapped to two binary digits as follows: A=00, T=01, C=10, and G=11. Assuming k=10 so that 10-mer DNA sequences are to be used, at block 402, the remainder R from the modulus calculation of block 208 can be retrieved from cached files 114. The remainder can be expressed as:

$$R=\text{mod}(F, 2^{20}).$$

For the word "music" the remainder is 18684.

Figure 4:
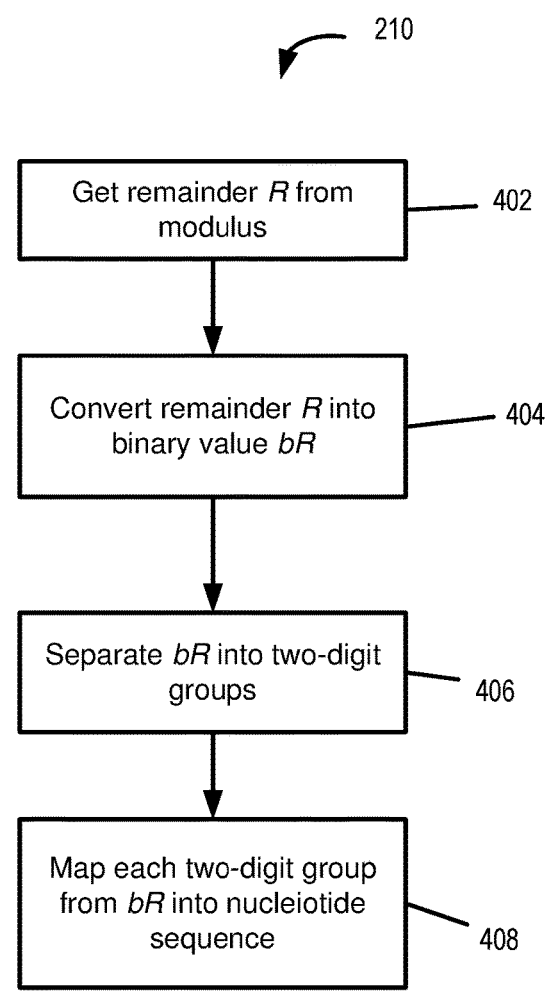
FIG. 4 is a flowchart illustrating an additional process used in encoding words according to further aspects of the present disclosure.

At block 404 of FIG. 4, the remainder R is converted into a binary value bR. The binary remainder bR is 20 digits or less. If the remainder is less than 20 digits, trailing zeros can be added to make bR 20 digits long. For the word "music," bR=10010001111110000000. At block 406, the remainder bR is separated into two-digit groups. Group 1 includes digits from position 1 and 2 of bR, group 2 includes digits from position 3 and 4 of bR, etc. At block 408, each two-digit group is mapped to a nucleotide sequence. For example, each two-digit group can be mapped to a nucleotide sequence as follows: 00=A, 01=T, 10=C, and 11=G. Thus, the 10-mer DNA sequence for the word "music" is in this example a mapping of two-digit groups to form the sequence GTATCCGAAA (SEQ ID NO: 1).

A code unit size is generally equivalent to the bit measurement for the particular encoding. For example, an ASCII character in 8-bit ASCII encoding is 8 bits (1 byte) long. If an English word contains m ASCII characters, then the storage space needed for the word is 8 m. For example, the word communication contains 13 characters and would need 104 bits storage space in ASCII computer files. By using 10-mer DNA encoding as described above, an English word needs 20 bits for storage, regardless of its length. DNA encoding as described herein therefore provides compression resulting in less storage space being used even when the DNA sequences are maintained in digital format rather than being synthesized into DNA.

Figure 5:
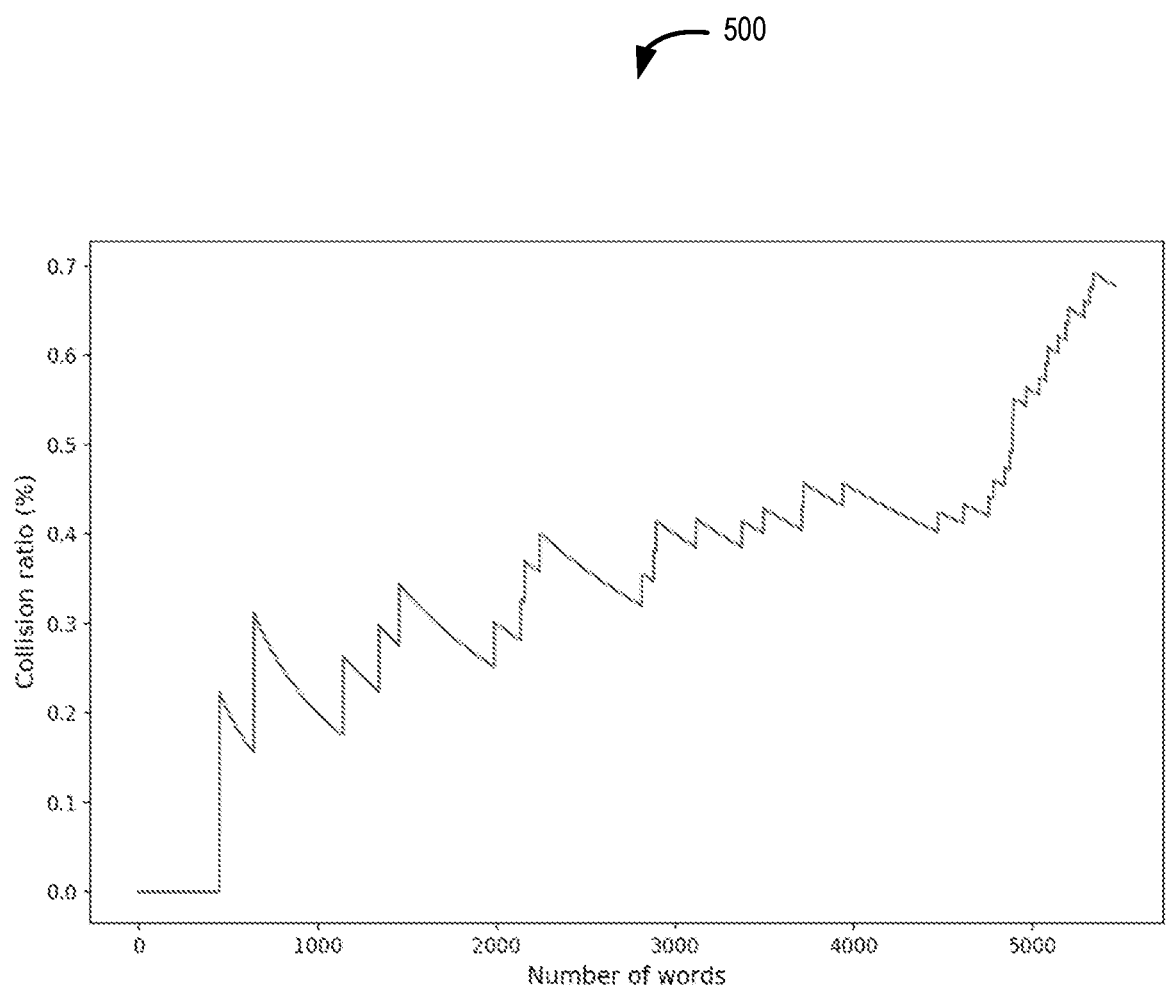
FIG. 5 is a collision ratio diagram for an example of DNA-encoded text produced by a system for encoding and storing words in DNA sequences according to some aspects of the present disclosure.

FIG. 5 is the collision ratio diagram 500 for an example of DNA-encoded text produced by a system for encoding and storing words in DNA sequences according to some aspects of the present disclosure. The highest collision ratio in the diagram 500 is less than 0.675%. The text sample used was, Brants, Thorsten et al., Web 1T 5-gram Version 1, LDC2006T13 on DVD, Linguistic Data Consortium, 2006.

The system discussed herein are not limited to any particular hardware architecture or configuration. A computing device can include any suitable arrangement of components that provides a result conditioned on one or more inputs. Suitable computing devices include multipurpose microprocessor-based computing systems accessing stored software that programs or configures the computing system from a general-purpose computing apparatus to a specialized computing apparatus implementing one or more aspects of the present subject matter. Any suitable programming, scripting, or other type of language or combinations of languages may be used to implement the teachings contained herein in software to be used in programming or configuring a computing device.

Aspects of the methods disclosed herein may be performed in the operation of such computing devices. The order of the blocks presented in the examples above can be varied—for example, blocks can be re-ordered, combined, or broken into sub-blocks. Certain blocks or processes can be performed in parallel.

The use of "configured to" herein is meant as open and inclusive language that does not foreclose devices configured to perform additional tasks or steps. Additionally, the use of "based on" is meant to be open and inclusive, in that a process, step, calculation, or other action "based on" one or more recited conditions or values may, in practice, be based on additional conditions or values beyond those recited. Headings, lists, and numbering included herein are for ease of explanation only and are not meant to be limiting.

The foregoing description of the examples, including illustrated examples, of the subject matter has been presented only for the purpose of illustration and description and is not intended to be exhaustive or to limit the subject matter to the precise forms disclosed. Numerous modifications, adaptations, and uses thereof will be apparent to those skilled in the art without departing from the scope of this subject matter. The illustrative examples described above are given to introduce the reader to the general subject matter discussed here and are not intended to limit the scope of the disclosed concepts.

What is claimed is:

1. A system comprising:
a processor; and
a memory that stores executable instructions that, when executed by the processor, facilitate performance of operations, comprising:
receiving a word to be converted into a DNA sequence;
determining that the word is present in a DNA dictionary;
obtaining the DNA sequence from the DNA dictionary;
synthesizing a DNA molecule of the DNA sequence;
receiving a second word to be converted into a second DNA sequence;
determining that the second word is not present in the DNA dictionary;
determining a value of a polynomial function based on the second word, wherein the determining the value of the polynomial function comprises converting each letter of the second word to a letter number and calculating a sum of a position-th power of each letter number for each letter multiplied by the letter number;
obtaining a remainder of a modulus of the value of the polynomial function;
converting the remainder of the modulus into the second DNA sequence; and
storing the second DNA sequence in the DNA dictionary.

2. The system of claim 1, the operations further comprising:
synthesizing a second DNA molecule of the second DNA sequence; and
storing the second DNA molecule.

3. The system of claim 1, wherein the second DNA sequence comprises a nucleotide sequence of a length corresponding to a power of two used to determine the modulus.

4. The system of claim 3, wherein the nucleotide sequence further comprises a mapping of two-digit groups from a binary value of the remainder.

5. The system of claim 1, wherein the determining the value of the polynomial function based on the second word further comprises converting each letter of the second word to uppercase.

6. The system of claim 1, wherein the converting the remainder of the modulus into the second DNA sequence comprises:
separating a binary value of the remainder into a plurality of two-digit groups; and
mapping the plurality of two-digit groups into a nucleotide sequence.

7. The system of claim 2, wherein the converting the remainder of the modulus into the second DNA sequence comprises:
separating a binary value of the remainder into a plurality of two-digit groups; and
mapping the plurality of two-digit groups into a nucleotide sequence.

8. A method comprising:
receiving, by a processing system including a processor, a word to be converted into a DNA sequence;
determining, by the processing system, that the word is present in a DNA dictionary;
obtaining, by the processing system, the DNA sequence from the DNA dictionary;
synthesizing, by the processing system, a DNA molecule of the DNA sequence;
receiving, by the processing system, a second word to be converted into a second DNA sequence;
determining, by the processing system, that the second word is not present in the DNA dictionary;
determining, by the processing system, a value of a polynomial function based on the second word, wherein the determining the value of the polynomial function comprises converting each letter of the second word to a letter number and calculating a sum of a position-th power of each letter number for each letter multiplied by the letter number;
obtaining, by the processing system, a remainder of a modulus of the value of the polynomial function;
converting, by the processing system, the remainder of the modulus into the second DNA sequence; and
storing, by the processing system, the second DNA sequence in the DNA dictionary.

9. The method of claim 8, further comprising:
synthesizing a second DNA molecule of the second DNA sequence; and
storing the second DNA molecule.

10. The method of claim 8, wherein the second DNA sequence comprises a nucleotide sequence of a length corresponding to a power of two used to determine the modulus.

11. The method of claim 10, wherein the nucleotide sequence further comprises a mapping of two-digit groups from a binary value of the remainder.

12. The method of claim 8, wherein the determining the value of the polynomial function based on the second word further comprises converting each letter of the second word to uppercase.

13. A non-transitory computer-readable medium including computer program code executable by a processor to cause the processor to perform operations, the operations comprising:
receiving a word to be converted into a DNA sequence;
determining that the word is present in a DNA dictionary;

obtaining the DNA sequence from the DNA dictionary;
synthesizing a DNA molecule of the DNA sequence;
receiving a second word to be converted into a second DNA sequence;
determining that the second word is not present in the DNA dictionary;
determining a value of a polynomial function based on the second word, wherein the determining the value of the polynomial function comprises converting each letter of the second word to a letter number and calculating a sum of a position-th power of each letter number for each letter multiplied by the letter number;
obtaining a remainder of a modulus of the value of the polynomial function;
converting the remainder of the modulus into the second DNA sequence; and
storing the second DNA sequence in the DNA dictionary.

14. The method of claim 8, wherein the converting the remainder of the modulus into the second DNA sequence comprises:
    separating a binary value of the remainder into a plurality of two-digit groups; and
    mapping the plurality of two-digit groups into a nucleotide sequence.

15. The non-transitory computer-readable medium of claim 13, the operations further comprising:
    synthesizing a second DNA molecule of the second DNA sequence; and
    storing the second DNA molecule.

16. The non-transitory computer-readable medium of claim 13, wherein the second DNA sequence comprises a nucleotide sequence of a length corresponding to a power of two used to determine the modulus.

17. The non-transitory computer-readable medium of claim 16, wherein the nucleotide sequence further comprises a mapping of two-digit groups from a binary value of the remainder.

18. The non-transitory computer-readable medium of claim 13, wherein the determining the value of the polynomial function based on the second word further comprises converting each letter of the second word to uppercase.

19. The non-transitory computer-readable medium of claim 13, wherein the converting the remainder of the modulus into the second DNA sequence comprises:
    separating a binary value of the remainder into a plurality of two-digit groups; and
    mapping the plurality of two-digit groups into a nucleotide sequence.

20. The non-transitory computer-readable medium of claim 13, wherein the converting the remainder of the modulus into the second DNA sequence comprises:
    separating a binary value of the remainder into a plurality of two-digit groups; and
    mapping the plurality of two-digit groups into a nucleotide sequence.

* * * * *

SEQUENCE LISTING

<160> NUMBER OF SEQ ID NOS: 1

<210> SEQ ID NO 1
<211> LENGTH: 10
<212> TYPE: DNA
<213> ORGANISM: Artificial Sequence
<220> FEATURE:
<223> OTHER INFORMATION: Synthetic

<400> SEQUENCE: 1
gtatccgaaa                                                           10